(12) United States Patent
Itzler et al.

(10) Patent No.: US 7,626,193 B2
(45) Date of Patent: Dec. 1, 2009

(54) APPARATUS COMPRISING A SINGLE PHOTON PHOTODETECTOR HAVING REDUCED AFTERPULSING AND METHOD THEREFOR

(75) Inventors: Mark Allen Itzler, Princeton, NJ (US); Rafael Ben-Michael, Scotch Plains, NJ (US); Sabbir Sajjad Rangwala, Flemington, NJ (US)

(73) Assignee: Princeton Lightwave, Inc., Cranbury, NJ (US)

( * ) Notice: Subject to any disclaimer, the term of this patent is extended or adjusted under 35 U.S.C. 154(b) by 719 days.

(21) Appl. No.: 11/277,562

(22) Filed: Mar. 27, 2006

(65) Prior Publication Data

US 2007/0221930 A1 Sep. 27, 2007

(51) Int. Cl.
*H01L 31/058* (2006.01)

(52) U.S. Cl. .......... 257/31.063; 257/E31.064; 257/108; 257/113; 257/129; 257/146; 257/168; 257/175; 257/186; 257/199; 257/322; 257/467; 257/481; 257/603; 257/431; 257/438; 250/336.1; 250/338.1; 250/338.4; 250/339.03; 250/340; 250/341.1; 250/352

(58) Field of Classification Search .......... 257/E31.063, 257/E31.064, 108, 113, 129, 168, 175, 186, 257/199, 322, 431, 438, 467, 481, 603; 250/336.1, 250/338.1, 338.4, 339.03, 339.04, 340, 341.1, 250/352, 370.14, 370.15

See application file for complete search history.

(56) References Cited

U.S. PATENT DOCUMENTS

2002/0197603 A1* 12/2002 Chow et al. .................... 435/6
2004/0033004 A1*  2/2004 Welch et al. .................. 385/14

OTHER PUBLICATIONS

Michael A. Krainak, Photoionization of Trapped Carriers in Avalanche Photodiodes to Reduce Afterpulsing During Geiger-Mode Photon Counting, NASA Goddard Space Flight Center, Laser and Electro-Optics Branch, Greenbeld, MD.
Paul L. Voss et al., 14MHz rate photon counting with room temperature InGaAs/InP avalanche photodiodes, Journal of Modern Optics, Jun. 15-Jul. 10, 2004, 1369-1379, vol. 51, No. 9-10, Taylor & Francis Ltd.
Sergio Cova, et al., Trapping Phenomena in Avalanche Photodiodes on Nanosecond Scale, IEEE Electron Device Letters, Dec. 1991, vol. 12, No. 12, IEEE.
Roland H. Haitz, Mechanisms Contributing to the Noise Pulse Rate of Avalanche Diodes, Journal of Applied Physics, Oct. 1965, vol. 36, No. 10.

* cited by examiner

*Primary Examiner*—Wael Fahmy
*Assistant Examiner*—Hrayr A Sayadian
(74) *Attorney, Agent, or Firm*—DeMont & Breyer, LLC (57) ABSTRACT

A single-photon detector is disclosed that provides reduced afterpulsing without some of the disadvantages for doing so in the prior art. An embodiment of the present invention provides a stimulus pulse to the active area of an avalanche photodetector to stimulate charges that are trapped in energy trap states to detrap. In some embodiments of the present invention, the stimulus pulse is a thermal pulse.

16 Claims, 4 Drawing Sheets

APPARATUS COMPRISING A SINGLE PHOTON PHOTODETECTOR HAVING REDUCED AFTERPULSING AND METHOD THEREFOR

FIELD OF THE INVENTION

The present invention relates to avalanche photodetectors in general, and, more particularly, to single-photon avalanche photodetectors.

BACKGROUND OF THE INVENTION

A semiconductor photodetector generates a free-carrier pair (electron-hole) when it absorbs a photon. When the photodetector is subjected to an electric field (by the application of a bias voltage to the photodetector), free-carriers generated in the photodetector give rise to a macroscopic electric current.

A useful photodetector is characterized by high overall efficiency and high sensitivity. Efficiency can be defined as the number of free carriers that are generated per incident photon. Consequently, high efficiency implies a high generated current for a given incident optical power. Sensitivity is characterized by the minimum optical signal that gives rise to a current that can be distinguished from the background current due to noise (e.g., dark current, thermal noise, Johnson noise, 1/F noise, etc.).

One widely-used type of photodetector is the avalanche photodetector. Avalanche photodetectors have high sensitivity and, in fact, can be made sensitive enough to detect even a single photon. Avalanche photodetectors are so named because of the "avalanche" of free-carrier pairs that is generated by the detector. The "avalanche" is the result of a multiplication of the free-carrier pairs. The multiplication occurs when the free-carrier pairs that were generated by incident photons are accelerated to high energies by an applied reverse bias voltage. As the accelerated free carriers travel through the multiplication region of the avalanche photodetector, they collide with bound carriers in the atomic lattice of the multiplication region, generating more free carriers through a process called "impact ionization."

The current flow in the avalanche photodetector is directly related to the number of free carriers generated from electron-hole pairs. The gain of a photodetector (i.e., the increase in the number of free carrier pairs) is a function of the reverse bias voltage applied to the photodetector.

An avalanche photodetector is characterized by a "breakdown voltage." When the avalanche photodetector is biased above its breakdown voltage, carrier generation can become self-sustaining and result in run-away avalanche. In order to function as a single-photon detector, an avalanche photodetector is biased above its breakdown voltage. This is referred to as "arming" the avalanche photodetector. Once the detector is armed, the single free carrier created by the absorption of a single photon can create a runaway avalanche resulting in an easily detectable macroscopic current. It is also possible for a free carrier to be created by mechanisms other than photon absorption (e.g., thermal excitation and carrier tunneling). These "dark" carriers can give rise to the same easily detectable macroscopic current, in this case referred to as false counts, or "dark counts." Dark counts constitute noise in a single-photon avalanche detector, and therefore reduce its sensitivity.

After a photon (or dark count) is detected, it is necessary to stop the self-sustained avalanche in order to make further use of the detector. In order to halt the avalanche process, the bias voltage of the avalanche photodetector is reduced below its breakdown voltage. This process is referred to as "quenching" the avalanche photodetector. Although quenching stops the avalanche process, not all free carriers are swept out of the avalanche region. Instead, some carriers become trapped in trap states that exist in the multiplication region due to crystalline defects or other causes which create energy levels within the semiconductor band gap of the multiplication region material.

At a later time, trapped carriers "detrap," again becoming free carriers. These detrapped carriers can become an additional source of dark counts. The creation of additional dark counts caused by spurious, uncontrolled emission of trapped charges after quenching is referred to as "afterpulsing." Afterpulsing raises the total dark count rate above the baseline dark count rate established by thermal carrier emission and carrier tunneling in the absence of afterpulsing. Since any increase of dark count rate degrades the performance of a single-photon detector, elimination of afterpulsing is of great interest.

Several strategies exist in the prior art for reducing afterpulsing. Trapped charges will generally become free carriers in random fashion due to their thermal emission from the trap. Therefore, one approach used is to simply wait a sufficient period of time after quenching to allow trapped charges to detrap on their own (i.e., the inherent "detrapping time." If the inherent detrapping time is long, this approach leads to an undesirably long period of time when the single-photon detector is inoperable. In gated-mode operation, wherein a bias voltage pulse is periodically applied to arm the avalanche photodetector (i.e., a "gating pulse"), simply waiting for thermal emission of trapped carriers reduces the repetition rate at which single photons can be measured.

A second prior-art approach for reducing afterpulsing is to operate the single-photon detector at an elevated temperature to promote detrapping. But operating at an elevated temperature results in an increase in the baseline dark count rate due to an increase in thermal carrier emission and carrier tunneling processes.

In a third prior-art approach for reducing afterpulsing, trapped carriers are photoionized via "sub-band illumination." In this approach, the photodetector is illuminated by a beam of light. The energy of the photons in this beam of light is a function of the wavelength of the light. Photons in longer-wavelength light have relatively lower energy than photons in shorter-wavelength light. The wavelength of light used in this prior-art approach is selected to provide photoionization energy sufficient only to detrap carriers, but insufficient to liberate carriers that are not in trapped states.

To avoid the detection of the sub-band illumination by the photodetector, the wavelength of light used for sub-band illumination must be longer than the detection limit, or "cutoff wavelength," of the absorbing material in the photodetector. In the case of an indium-phosphide-based avalanche photodetector with an indium-gallium-arsenide absorbing material, the wavelength of light used for sub-band illumination is greater than 1700 nanometers.

There exists a need, therefore, for a single-photon detector with reduced afterpulsing that overcomes some of the limitations of the prior art.

SUMMARY OF THE INVENTION

The present invention enables single photon detection without some of the costs and disadvantages for doing so in the prior art. For example, embodiments of the present invention enable high-repetition-rate gated-mode operation of a single-photon detector.

In accordance with the illustrative embodiment of the present invention, trapped carriers in the photodetector are excited by a pulse of stimulating energy, such as a thermal pulse. This proactive excitation of trapped carriers clears energy trap states. This reduces the probability of random emissions of these carriers, as might otherwise occur in the absence of the stimulus (e.g., during conventional operation as a single-photon detector, etc.). As a result, the dark count rate of the photodetector during single-photon operation is reduced.

Embodiments of the present invention, like the prior art, use an avalanche photodetector that is biased above its breakdown voltage to detect the incidence of a single photon. Like the prior art, some embodiments of the present invention proactively excite carriers that are in energy trap states, thereby reducing afterpulsing. But unlike the prior art, in the illustrative embodiment of the present invention, trapped carriers are only temporarily excited.

More particularly, in the prior art, photodetectors have been operated at an elevated temperature to stimulate the emission of trapped carriers from energy trap states. These photodetectors remain at this elevated temperature during operation as a single-photon detector. As a result, prior-art single-photon photodetectors are subject to high dark count rates. In contrast, the present invention applies only a pulse of thermal energy to the photodetector to temporarily raise the temperature of a photodetector. The photodetector is not operated in single-photon detection mode during the application of the stimulating pulse. The thermal pulse substantially clears energy trap states of carriers so that the photodetector has a reduced dark count rate when it is subsequently operated as a single-photon photodetector.

An embodiment of the present invention comprises: an avalanche photodetector having a multiplication layer comprising a multiplication region; and a stimulator, wherein the stimulator provides a stimulus pulse, and wherein the stimulus pulse detraps electrical carriers in the avalanche photodetector.

DETAILED DESCRIPTION

The following terms are defined for use in this Specification, including the appended claims:

Monolithically-integrated means formed either: (1) in the body of a layer or substrate, typically by etching into the layer or substrate or; (2) on the surface of the layer or substrate, typically by patterning layers disposed on the surface.

Thermal-cycling means temporarily changing a temperature to cause an effect. An example of thermal-cycling is the rapid-thermal annealing of a substrate to induce crystal growth or stress relaxation.

Pulse means a brief sudden change in a normally constant quantity. Examples of pulses include, without limitation: (1) a thermal pulse, wherein a short rapid increase in the temperature of an element or portion of an element is produced; and (2) a voltage pulse, wherein a short rapid increase in a voltage is produced.

Multiplication region means a region of an avalanche photodetector wherein avalanche gain predominantly occurs.

Figure 1:
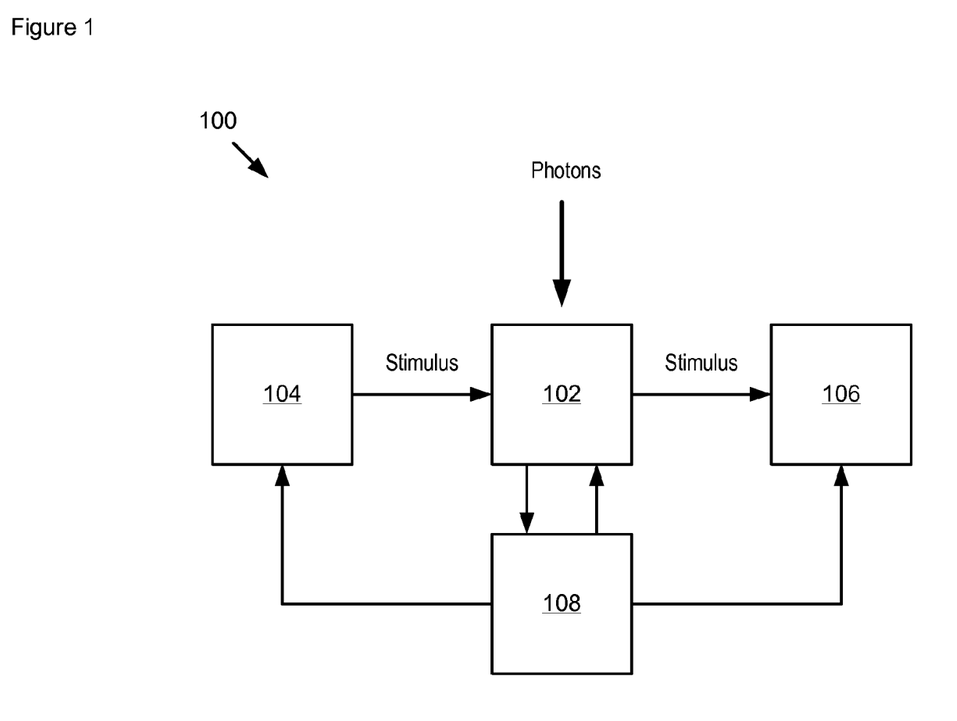
FIG. 1 depicts a schematic diagram of the salient components of single-photon detection system 100 according to an illustrative embodiment of the present invention.

FIG. 1 depicts a schematic diagram of the salient components of single-photon detection system 100 according to an illustrative embodiment of the present invention. Single-photon detection system 100 comprises photodetector 102, stimulator 104, stimulus sink 106, and controller 108. Single-photon detection system 100 is a system that provides a macroscopic current in response to the incidence of a single photon on photodetector 102.

Photodetector 102 is an indium-phosphide-based avalanche photodetector having separate absorption and multiplication regions. Photodetector 102 will be described in detail below and with respect to FIG. 2. In some embodiments, photodetector 102 is an avalanche photodetector formed using material systems other than indium-phosphide. It will be clear to those skilled in the art, after reading this specification, how to make and use embodiments of the present invention that comprise avalanche photodetectors that are based on any suitable material system.

Stimulator 104 is a stimulator for providing a pulse of stimulating energy to electrical carriers that have become trapped in energy level traps in the multiplication region of photodetector 102. The energy provided by stimulator 104 proactively excites the trapped carriers out of their energy trap states. In other words, the pulse of stimulating energy "detraps" the trapped carriers. During the time when stimulating energy is being applied to photodetector 102, the photodetector is biased below breakdown and can not detect either incident photons or dark carriers. Therefore, photodetector 102 is inoperative for single-photon detection during the duration of the stimulus pulse. After the pulse of stimulating energy ends, however, photodetector 102 can again be made operative for single-photon detection. In some embodiments, stimulator 104 provides stimulating energy to photodetector 102 as a whole. In some other embodiments, stimulator 104 provides stimulating energy to a selected portion or portions of photodetector 102.

Stimulus sink 106 is an element for drawing stimulating energy away from the active area of photodetector 102. Stimulus sink 106 facilitates a rapid decay of the stimulating energy in the active area of photodetector 102, which thereby shortens the time during which photodetector 102 is inoperative for single-photon detection. In some embodiments, stimulus sink 106 is a passive element, such as a high stimulus-conductivity path that facilitates the conduction of the stimulus away from the active area of photodetector 102. In some other embodiments, stimulus sink 106 is an active element that draws the stimulus away from the active area of the photodetector 102.

Controller 108 is a general purpose processor and power supply. Controller 108 provides a bias voltage to photodetector 102, receives electrical signals from photodetector 102, stores and processes data, and provides power and control signals to stimulator 104 and stimulus sink 106. In the illustrative embodiment of the present invention, controller 108 controls the sequence of arming photodetector 102, quenching photodetector 102, and stimulating trapped carriers in photodetector with a stimulus pulse, and actively sinking stimulating energy from photodetector 102. In some embodiments of the present invention, stimulus sink 106 is a passive element that does not require control by controller 108.

Figure 2:
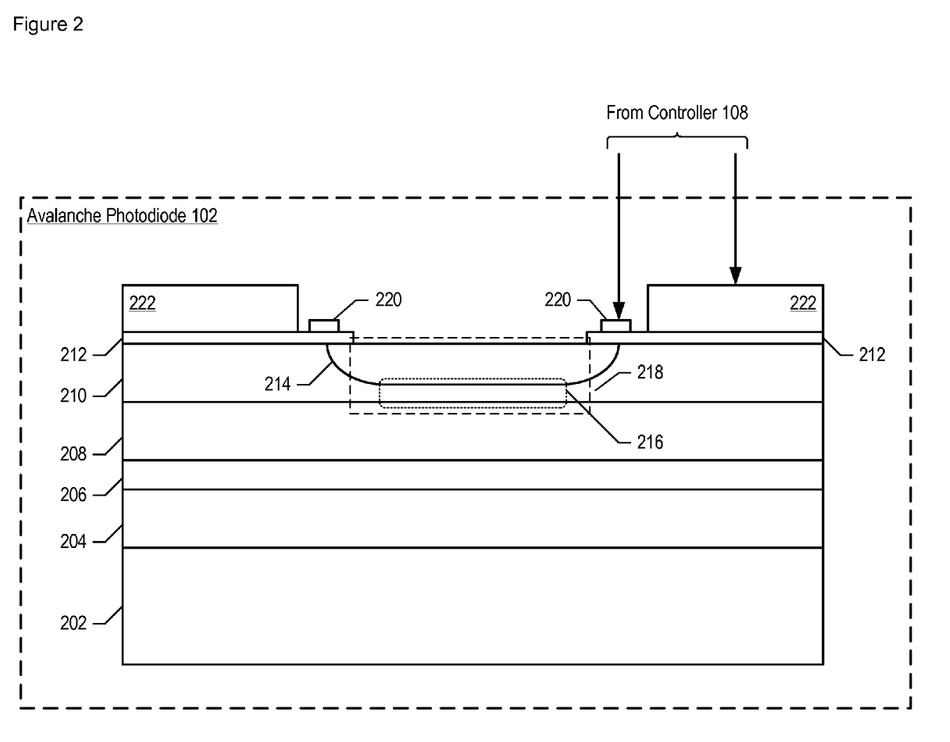
FIG. 2 depicts a schematic diagram of the salient components of a photodetector according to an illustrative embodiment of the present invention.

FIG. 2 depicts a schematic diagram of the salient components of a photodetector according to an illustrative embodiment of the present invention. Photodetector 102 comprises substrate 202, absorption layer 204, grading layer 206, field control layer 208, layer 210, passivation layer 212, heater 220, and Peltier cooler 222. Layer 210 comprises active region 218, which comprises diffused-region 214 and multiplication region 216.

Substrate 202 is a substrate suitable for use in the formation of an avalanche photodetector, as is well-known in the art.

Absorption layer 204 is a lightly-doped layer of indium gallium arsenide (InGaAs) with low band-gap energy. It will be clear to those skilled in the art how to make and use absorption layer 104.

Grading layer 206 is an n-doped indium gallium arsenide phosphide (InGaAsP) layer that smoothes the interface between absorption layer 204 and field control layer 208.

Field control layer 208 is a moderately n-doped layer of indium phosphide. Field control layer 208 enables maintenance of a low electric field in absorption layer 204, while supporting a high electric field in multiplication region 216. It will be clear to those skilled in the art how to make and use field control layer 208.

Multiplication layer 210 is an intrinsic layer of indium phosphide. Within multiplication layer 210 is active region 218 which includes diffused-region 214 and multiplication region 216. Active region 218 is formed by diffusing a high level of p-type dopant into multiplication layer 210 to form diffused region 214. The extent of diffused region 214 forms a p-n junction. The undoped portion of active region 218 forms multiplication region 216. Avalanche multiplication occurs substantially in multiplication region 216. In some embodiments of the present invention, multiplication layer 210 is a lightly n-doped layer of indium phosphide and diffused region 214 is heavily doped with a p-type dopant. In some other embodiments, multiplication layer 210 is a lightly p-doped layer of indium phosphide and diffused-region 214 is heavily doped with an n-type dopant. It will be clear to those skilled in the art, after reading this specification, how to make and use embodiments of the present invention in which multiplication layer 210 is other than an intrinsic layer of indium phosphide.

Passivation layer 212 is a layer of silicon nitride that has a thickness of 100 nanometers. In some other embodiments, passivation layer 212 has a thickness other than 100 nanometers. In some embodiments, passivation layer 212 comprises thinned regions on which heater 220 and/or Peltier cooler 222 are disposed to facilitate thermal conduction to and from heater 220 and/or Peltier cooler 222. It will be clear to those skilled in the art, after reading this specification, how to make and use passivation layer 212.

Heater 220 is a thin-film resistive heater having a semi-annular shape, which is deposited on top of passivation layer 212 just outside the lateral extent of active region 218. Heater 220 composes stimulator 104, as described above and with respect to FIG. 1. When an electric current is provided to heater 220 by controller 108, heater 220 rapidly heats active region 218. In the illustrative embodiment, the duration of electric current pulses is less than 50 nanoseconds. In some embodiments, the duration of electric current pulses can be as long as several hundred nanoseconds. In some embodiments, electric current pulses as short as 1 to 5 nanoseconds are used. The duration of the current pulse (and, therefore, the heat pulse in active region 218) influences the repetition rate at which detrapping can occur. It will be clear to those skilled in the art, after reading this specification, how to make and use alternative embodiments of the present invention that utilize electric current pulses to heater 220 that are other than 50 nanoseconds in duration.

In the illustrative embodiment, heater 220 and photodetector 102 are monolithically-integrated. In some alternative embodiments of the present invention, heater 220 and photodetector 102 are not monolithically-integrated. In yet some further embodiments of the present invention, heater 220 radiates heat to at least a portion of photodetector 102. It will be clear to those skilled in the art, after reading this specification, how to make and use embodiments of the present invention wherein heater 220 and photodetector 102 are not monolithically-integrated.

In the illustrative embodiment, thermal energy is the stimulating energy for detrapping trapped carriers in photodetector 102. In some alternative embodiments, thermal energy is imparted to active region by pulsing optical energy onto photodetector 102. The wavelength of this optical energy is chosen such that active region 218 will absorb a significant amount of the optical energy and convert it to thermal energy. Suitable wavelengths for this optical energy include those equal to or less than 900 nanometers when the active region comprises indium-phosphide. For embodiments that include a different active region material, suitable wavelengths will be those for which the photon energy is greater than the band gap energy of the active region material.

In some alternative embodiments, thermal energy is imparted to active region 218 by pulsing optical energy onto an absorption layer deposited on photodetector 102. Suitable materials for use in absorption layers include, without limitation, silicon, silicon dioxide, silicon nitride, silicon carbide, tungsten, titanium, titanium-tungsten, titanium nitride, and organic materials. In some embodiments, the wavelength of the optical energy can be greater than 900 nanometers, since suitable wavelengths for the optical energy will be dependent upon the absorption characteristics of the materials used in the absorption layer.

In the illustrative embodiment, stimulator 104 comprises heater 220, which stimulates trapped charges with pulses of thermal energy. In some other embodiments, stimulator 104 stimulates trapped charges with pulses of other forms of energy. It will be clear to those skilled in the art, after reading this specification, how to make and use alternative embodiments of the present invention that comprise stimulators that stimulate trapped charges with pulses of such other forms of energy.

Peltier cooler 222 is a thermo-electric cooler having an annular shape, as is well-known in the art. Peltier cooler 222 facilitates the rapid removal of heat from active region 218 after heater 220 has turned off. Peltier cooler 222 composes stimulus sink 106 as described above and with respect to FIG. 1. The speed at which Peltier cooler 222 removes heat from active region 218 influences the repetition rate at which detrapping can occur and the percentage of time in which single-photon detection system 100 is operative.

In some alternative embodiments of the present invention, a passive stimulus sink is used rather than an active stimulus sink. For example, in some of these embodiments, a thick-film metallization is used, rather than Peltier cooler 222, to provide a low thermal resistance path to conduct heat away from active region 218.

In still some other embodiments of the present invention, heater 220 and Peltier cooler 222 are combined into a single element. For example, a Peltier device can be used to either heat or cool, depending on the flow of current through it.

Therefore, in these embodiments, Peltier device 222 provides both heating and cooling functions.

Figure 3:
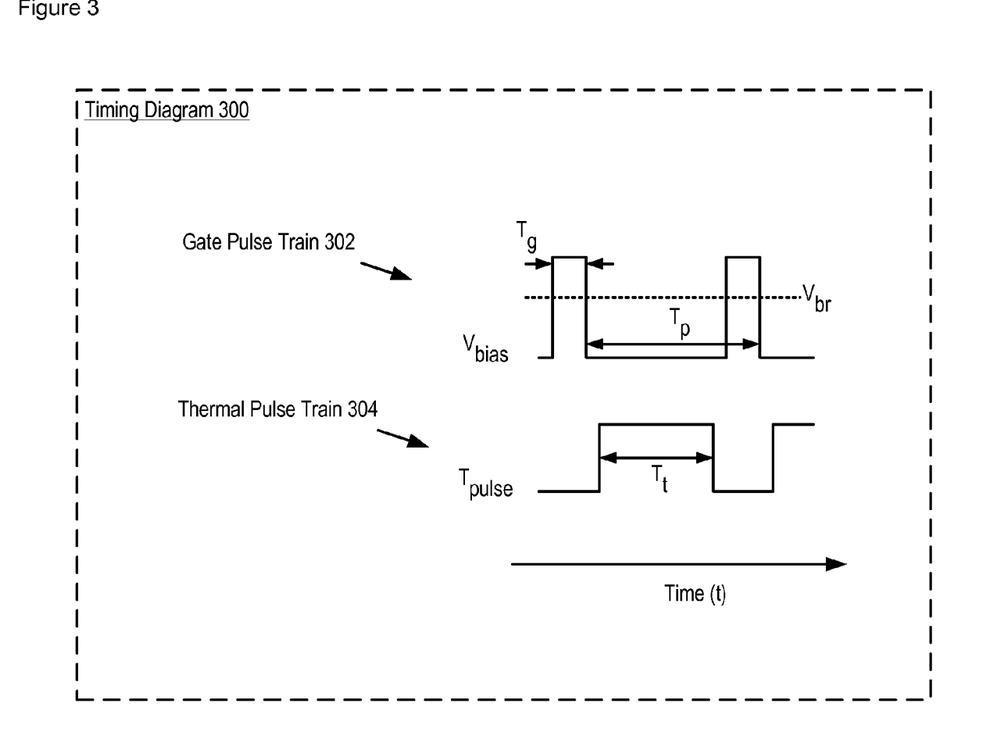
FIG. 3 depicts a representative timing diagram for photodetector gating and thermal pulsing, according to the illustrative embodiment of the present invention.

FIG. 3 depicts a representative timing diagram for photodetector gating and thermal pulsing, according to the illustrative embodiment of the present invention. Timing diagram 300 depicts the relationship between gate pulse train 302 and thermal pulse train 304. Gate pulse train 302 is a graphic representation of the bias voltage applied to photodetector 102.

Figure 4:
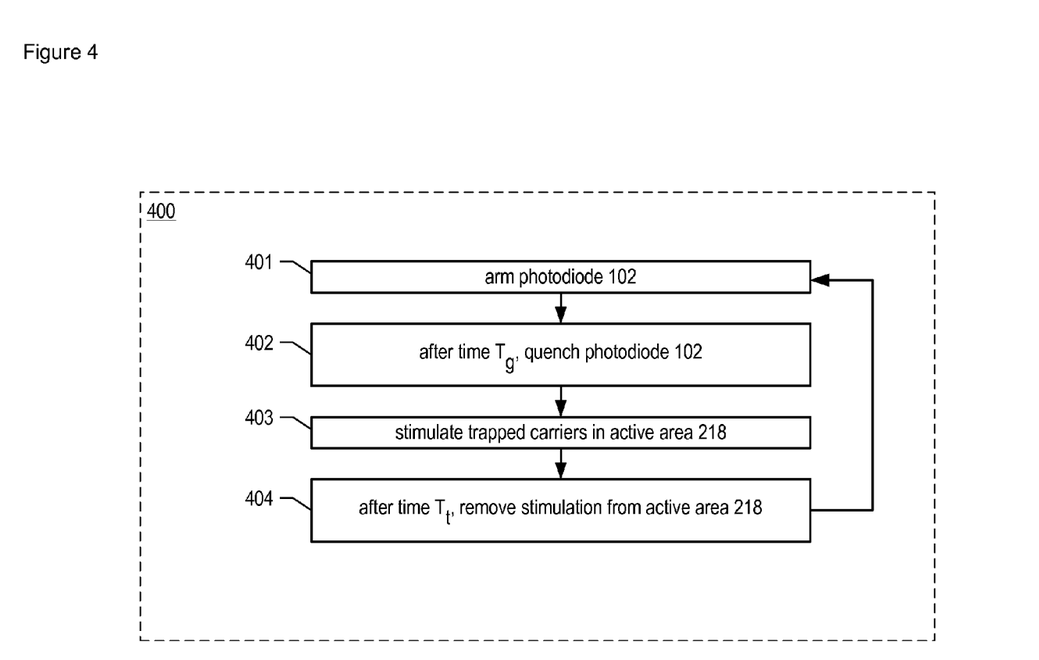
FIG. 4 depicts a method of operating a photodetector as a single-photon detector in gated-mode operation.

In order to more clearly demonstrate the present invention, operation of photodetector 102 as a single-photon detector is described here, with reference to FIGS. 2, 3 and 4.

FIG. 4 depicts a method of operating a photodetector as a single-photon detector in gated-mode operation. Since gated-mode operation comprises a repetitive cycle, only one such cycle is described here. In the gated-mode operation of photodetector 102, photodetector 102 is biased at a baseline voltage below its breakdown voltage, $V_{br}$. In order to arm photodetector 102, a gate pulse that increases the bias voltage above $V_{br}$ is applied to photodetector 102. The gate pulse has a gate-pulse period $T_p$ and a gate-pulse width of $T_g$. At the end of the gate pulse (i.e., at $T_g$), photodetector 102 is quenched by reducing the bias voltage once again below $V_{br}$. Therefore, when photodetector 102 detects a photon during a gate pulse, the resulting avalanche current signal is limited to the remainder of that gate pulse. At the end of that gate pulse, photodetector 102 is quenched by reducing the bias voltage back below $V_{br}$ to stifle the avalanche current.

Method 400 begins with operation 401, wherein photodetector 102 is armed for single-photon detection. To arm photodetector 102, processor 108 provides a bias voltage to photodetector 102 that is above its breakdown voltage, $V_{br}$. Operation 401 is depicted in FIG. 3 as the rising edge the first pulse of gate pulse train 302.

At operation 402, photodetector 102 is quenched by reducing the bias voltage below $V_{br}$. To quench photodetector 102, processor 108 provides a bias voltage to photodetector 102 that is below its breakdown voltage, $V_{br}$. This is depicted in FIG. 3 as the falling edge of the first pulse of gate pulse train 302. The time between operations 401 and 402 is equal to gate pulse width $T_g$, which in some embodiments of the present invention is approximately equal to 1 nanosecond.

At operation 403, active area 218 of photodetector 102 is provided with a stimulus to excite trapped carriers from their trapped states (i.e., cause them to detrap). In the illustrative embodiment, the stimulus comprises application of heat to active area 218. To heat active area 218, controller 108 provides electric current to heater 220. Operation 403 is depicted in FIG. 3 as the rising edge of the first pulse in thermal pulse train 304.

At operation 404, the stimulus applied to photodetector 102 is removed. To remove the stimulus, controller 108 stops the flow of electric current to heater 220 and provides electric current to Peltier cooler 222 to cause it to begin cooling active area 218. Operation 404 is depicted in FIG. 3 as the falling edge of the first pulse in thermal pulse train 304. The time between operations 403 and 404 is equal to thermal pulse width $T_p$, which in some embodiments of the present invention is in the range of sub-nanosecond to tens of nanoseconds, and in some embodiments is approximately equal to 1 nanosecond. In some embodiments of the present invention, which employ a passive stimulus sink, operation 404 does not include the provision of electric current to Peltier cooler 222.

After operation 404, photodetector 102 is ready to be armed for single-photon detection again. Since each gate pulse is followed by a thermal pulse to excite trapped carriers in photodetector 102 from their trapped states, the periodicity of method 400 is also equal to $T_p$. In some embodiments of the present invention, the sequence of temporally interleaved gate pulses and thermal pulses can be non-periodic.

Immediately after quenching photodetector 102, a thermal pulse is applied to photodetector 102 to heat active region 218. When active region 218 is heated, trapped carriers are stimulated to detrap. The rate at which trapped carriers detrap is a function of the temperature of active region 218 (i.e., they detrap more quickly at higher temperatures). The duration of the thermal pulse, $T_t$, is a function of the detrap rate, but can be as short as one nanosecond. Once the thermal pulse has ended (i.e., after $T_t$), photodetector 102 can be armed again. It should be noted that it is not necessary to wait until the temperature of active region 218 has dropped all the way to its base temperature before arming photodetector 102. Significant improvement in afterpulsing performance can be obtained from inducing a sufficient temperature swing between detrapping and application of a gate pulse.

In the prior art, $T_p$ is typically limited to at least tens of microseconds due to the time required to passively detrap trapped carriers. In contrast, the present invention utilizes active detrapping of trapped carriers by stimulating them to detrap. The present invention, therefore, enables gated-mode operation having a gate-pulse period, $T_p$, as short as 1 to 5 nanoseconds.

Therefore, photodetector 102 is armed during gate-pulse width, $T_g$. Timing diagram 300 depicts gated-mode operation with periodicity, $T_p$, equal to 50 nanoseconds.

Although the illustrative embodiment describes operation of photodetector 102 in gated-mode operation, it will be clear to those skilled in the art, after reading this specification, how to make and use alternative embodiments of the present invention that comprise operation of photodetector 102 in non-gated-mode operation. For example, in some alternative embodiments of the present invention, photodetector 102 remains armed until a photon is detected. Once photon detection has occurred, photodetector 102 is quickly quenched and a thermal pulse is applied to photodetector 102 to detrap trapped carriers. Subsequent to the thermal pulse, photodetector 102 is armed again to await detection of another photon.

In some embodiments of the present invention, photodetector 102 remains armed until controller 108 quenches and detraps it. In some embodiments of the present invention, controller 108 will quench, detrap, and arm photodetector 102 in response to the receipt of a stimulus by controller 108. In some embodiments of the present invention, controller 108 will quench, detrap, and arm photodetector 102 at the request of an operator. In some embodiments of the present invention, controller 108 will quench, detrap, and arm photodetector 102 after satisfaction of a preset condition, such as a duration between photon detections that exceeds a maximum time-period.

It is to be understood that the above-described embodiments are merely illustrative of the present invention and that many variations of the above-described embodiments can be devised by those skilled in the art without departing from the scope of the invention. For example, in this Specification, numerous specific details are provided in order to provide a thorough description and understanding of the illustrative embodiments of the present invention. Those skilled in the art will recognize, however, that the invention can be practiced without one or more of those details, or with other methods, materials, components, etc.

Furthermore, in some instances, well-known structures, materials, or operations are not shown or described in detail to avoid obscuring aspects of the illustrative embodiments. It is understood that the various embodiments shown in the Figures are illustrative, and are not necessarily drawn to scale. Reference throughout the specification to "one embodiment" or "an embodiment" or "some embodiments" means that a particular feature, structure, material, or characteristic described in connection with the embodiment(s) is included in at least one embodiment of the present invention, but not necessarily all embodiments. Consequently, the appearances of the phrase "in one embodiment," "in an embodiment," or "in some embodiments" in various places throughout the Specification are not necessarily all referring to the same embodiment. Furthermore, the particular features, structures, materials, or characteristics can be combined in any suitable manner in one or more embodiments. It is therefore intended that such variations be included within the scope of the following claims and their equivalents.

What is claimed is:

1. A method comprising providing a stimulating pulse to an avalanche photodetector, wherein the stimulating pulse is provided after the avalanche photodetector has been quenched and while the avalanche photodetector is biased below a breakdown voltage, and wherein the stimulating pulse is suitable for detrapping electrical carriers in the avalanche photodetector.

2. The method of claim 1 further comprising biasing the avalanche photodetector above the breakdown voltage after detrapping the electrical carriers.

3. The method of claim 1 wherein the stimulating pulse is applied to the avalanche photodetector after the detection of at least one of a photon and a dark carrier by the avalanche photodetector.

4. The method of claim 1 wherein the stimulating pulse is applied to the avalanche photodetector on a periodic basis.

5. The method of claim 1 further comprising gating the avalanche photodetector with a gating pulse.

6. A method comprising:
   quenching an avalanche photodetector;
   detrapping electrical carriers within the avalanche photodetector, wherein the detrapping comprises providing a stimulating pulse to the avalanche photodetector.

7. The method of claim 6 further comprising arming the avalanche photodetector after detrapping.

8. The method of claim 7 wherein the avalanche photodetector is armed by a controller, and wherein the controller arms the avalanche photodetector in response to at least one of:
   i) receipt of a stimulus by the controller;
   ii) satisfaction of a preset condition; and
   iii) a signal from an operator.

9. The method of claim 6 wherein the quenching occurs after the detection of at least one of a photon and a dark carrier.

10. The method of claim 6 wherein providing the stimulating pulse during the detrapping operation comprises providing a thermal pulse.

11. The method of claim 10 wherein the thermal pulse is radiated to the avalanche photodetector.

12. The method of claim 10 wherein providing the thermal pulse comprises applying an electric current to the avalanche photodetector.

13. The method of claim 10 wherein providing the thermal pulse comprises applying an electric current to a heater, and wherein the heater and the avalanche photodetector are monolithically-integrated.

14. The method of claim 10 wherein providing the thermal pulse comprises applying a pulse of optical energy to the avalanche photodetector.

15. The method of claim 14 wherein the photodetector comprises a multiplication region, and wherein the multiplication region is characterized by a bandgap energy, and further wherein the optical energy is characterized by having photon energy that is equal to or larger than the bandgap energy.

16. The method of claim 15 wherein the optical energy is characterized by a wavelength of less than or equal to 900 nanometers.

* * * * *

UNITED STATES PATENT AND TRADEMARK OFFICE
CERTIFICATE OF CORRECTION

PATENT NO. : 7,626,193 B2
APPLICATION NO. : 11/277562
DATED : December 1, 2009
INVENTOR(S) : Itzler et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 919 days.

Signed and Sealed this

Second Day of November, 2010

David J. Kappos
*Director of the United States Patent and Trademark Office*